(12) United States Patent
Shirakawa et al.

(10) Patent No.: US 6,493,249 B2
(45) Date of Patent: Dec. 10, 2002

(54) SEMICONDUCTOR APPARATUS, POWER CONVERTER AND AUTOMOBILE

(75) Inventors: Shinji Shirakawa, Hitachi (JP); Akira Mishima, Mito (JP); Hideshi Fukumoto, Hitachinaka (JP); Keiichi Mashino, Hitachinaka (JP); Toshiyuki Innami, Mito (JP)

(73) Assignee: Hitachi, Ltd., Tokoy (JP)

(*) Notice: Subject to any disclaimer, the term of this patent is extended or adjusted under 35 U.S.C. 154(b) by 60 days.

(21) Appl. No.: 09/791,731

(22) Filed: Feb. 26, 2001

(65) Prior Publication Data

US 2002/0011363 A1 Jan. 31, 2002

(30) Foreign Application Priority Data

Jul. 21, 2000 (JP) ........................ 2000-226192

(51) Int. Cl.[7] .............................................. H02M 1/00
(52) U.S. Cl. ...................................................... 363/147
(58) Field of Search ................................ 363/147, 144, 363/131; 361/720, 728

(56) References Cited

U.S. PATENT DOCUMENTS

| | | | |
|---|---|---|---|
| 4,172,279 A | * 10/1979 | Stein | 363/147 |
| 4,730,241 A | * 3/1988 | Takaya | 363/19 |
| 4,907,068 A | 3/1990 | Amann et al. | |
| 5,132,896 A | 7/1992 | Nishizawa et al. | |
| 5,161,098 A | * 11/1992 | Balakrishnan | 363/144 |
| 5,289,364 A | * 2/1994 | Sakurai | 363/147 |
| 5,604,383 A | * 2/1997 | Matsuzaki | 257/778 |
| 5,604,674 A | * 2/1997 | Terasawa | 363/147 |
| 5,621,636 A | * 4/1997 | Tanigawa et al. | 363/147 |
| 5,708,579 A | 1/1998 | Donegan et al. | |
| 6,028,779 A | 2/2000 | Sakamoto et al. | |

FOREIGN PATENT DOCUMENTS

| | | |
|---|---|---|
| EP | 0 649 215 A1 | 4/1995 |
| EP | 1 143 603 A2 | 10/2001 |
| JP | 11-089247 | 3/1999 |

* cited by examiner

Primary Examiner—Adolf Deneke Berhane
(74) Attorney, Agent, or Firm—Antonelli, Terry, Stout & Kraus, LLP

(57) ABSTRACT

A semiconductor apparatus includes positive and negative side conductors for bridge-connecting semiconductor switches, constituted to a wide conductor, and laminated by sandwiching an insulator between them. A semiconductor apparatus includes positive and negative side conductors extended from its case, and an electrolytic capacitor connected to the extension portion of the positive and negative side conductors. A power converter uses the semiconductor apparatus.

13 Claims, 8 Drawing Sheets

SEMICONDUCTOR APPARATUS, POWER CONVERTER AND AUTOMOBILE

BACKGROUND OF THE INVENTION

This invention relates to a semiconductor apparatus, a power converter and an automobile having a motor driven by the power converter.

JP-A-11-89247 can be cited as one of the prior art references. This technology relates to a method of reducing a wiring inductance as a cause of the increase of a loss and the occurrence of a jump-up voltage at the time of switching by using a laminate conductor plate assembled by laminating wiring lines for connecting a semiconductor apparatus and a capacitor with an insulator sandwiched between them, and reducing an inductance at a wiring portion at which the semiconductor apparatus and the capacitor are connected.

Semiconductor apparatuses for controlling a large current use in many cases a semiconductor switch having a low ON resistance so as to reduce a steady loss of the semiconductor switch. The semiconductor switch having a low ON resistance generally has a low device withstand voltage. Therefore, the wiring inductance that may invite the occurrence of a voltage exceeding the device withstand voltage at the time of switching must be reduced in such a semiconductor apparatus.

SUMMARY OF THE INVENTION

It is an object of the present invention to provide a semiconductor apparatus capable of reducing a wiring inductance as a cause of a jump-up voltage, a power converter, and an automobile using the power converter.

According to one aspect of the present invention, there is provided a semiconductor apparatus including at least two controllable semiconductor switches, at least one output terminal and a case equipped with the output terminal, wherein positive and negative side conductor plates for bridge-connecting the semiconductor switches are laminated with an insulator sandwiched between at least a part thereof, and the positive and negative side conductor plates so laminated are exposed to a surface of the case.

According to another aspect of the present invention, there is provided a power converter comprising a semiconductor apparatus and electrolytic capacitors, the semiconductor apparatus having a construction wherein positive and negative side conductors for bridge-connecting semiconductor switches are constituted into wide conductors or wide conductor plates, are so laminated as to sandwich an insulator between them, and are extended outside a case of the semiconductor apparatus, the electrolytic capacitors being connected to the extension portion of the positive and negative side conductors so laminated.

According to still another aspect of the present invention, there is provided an automobile having a motor driven by a power converter.

The technological contents of the present invention is not limited to the construction described above as will become more apparent from the following description of the invention.

DESCRIPTION OF THE EMBODIMENTS

Figure 1:
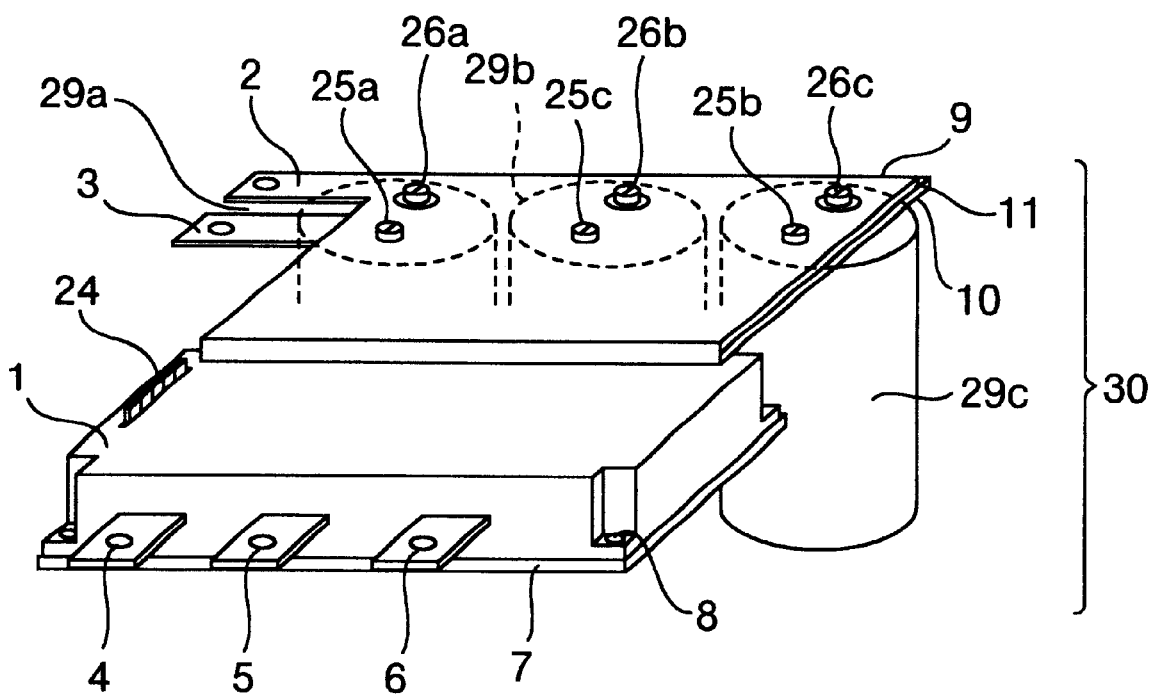
FIG. 1 is a perspective view of a module of a semiconductor apparatus according to one embodiment of the present invention.

Preferred embodiments of the present invention will be explained hereinafter with reference to FIGS. 1 to 9. Incidentally, like reference numeral will be used in these drawing to identify a constituent having the same function. In addition, a drive circuit for driving a semiconductor switch is omitted from the drawings to simplify illustration.

Figure 8:
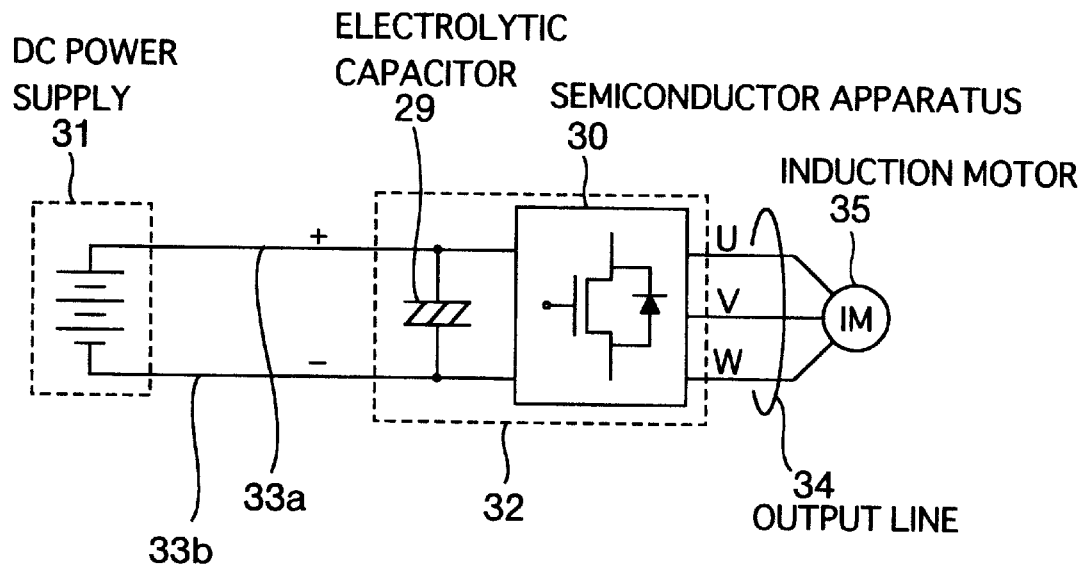
FIG. 8 is a structural view of the power converter.

FIG. 8 shows a structural example of a minimum necessary circuit of a power converter. In the drawing, reference numeral 30 denotes a semiconductor apparatus, reference numeral 31 denotes a DC power supply, reference numeral 32 denotes a power converter, reference numerals 33a and 33b denote main circuit lines, reference numeral 29 denotes an electrolytic capacitor, reference numeral 34 denotes an output line and reference numeral 35 denotes an induction motor (that is called also a "load"). The semiconductor apparatus 30 is constituted by a power semiconductor switching device such as a power MOSFET (Metal Oxide Semiconductor Field Effect Transistor) or IGBT (Insulated Gate Bipolar Transistor). In the description that follows, the lines inside the power converter, inclusive of lines inside the semiconductor apparatus, through which an output current flows, will be called "main circuit lines".

The semiconductor apparatus inputs a DC voltage and outputs an AC of a variable voltage and a variable frequency to the output lines 34 of a UVW phase. The induction motor 35 is driven by the current/voltage supplied through the output lines 34. The electrolytic capacitor 29 has the function of limiting fluctuation of a DC voltage by means of the switching operation of the semiconductor apparatus. The electrolytic capacitor 29 is not specifically limited to an electrolytic capacitor in the power converter according to the present invention. A capacitor having a large electrostatic capacitance may be used, too, depending on using conditions. The power converter 32 can convert the three-phase AC from UVW to a DC. The power converter described above can be used for a DC power supply. For instance, it is possible to convert once the AC power supply to the DC by using two semiconductor apparatuses 30, then to convert the DC to the three-phase AC and to thus drive the induction motor. One aspect of the present invention pertains to the semiconductor apparatus 30 and can be therefore applied to a power converter inputting the AC power supply described above.

Besides the constituents described above, the power converter further includes a circuit substrate for controlling the switching operation of the semiconductor apparatus 30, and cooling fins and a cooling fan for cooling the semiconductor apparatus 30, though they are not shown in FIG. 8

Figure 9:
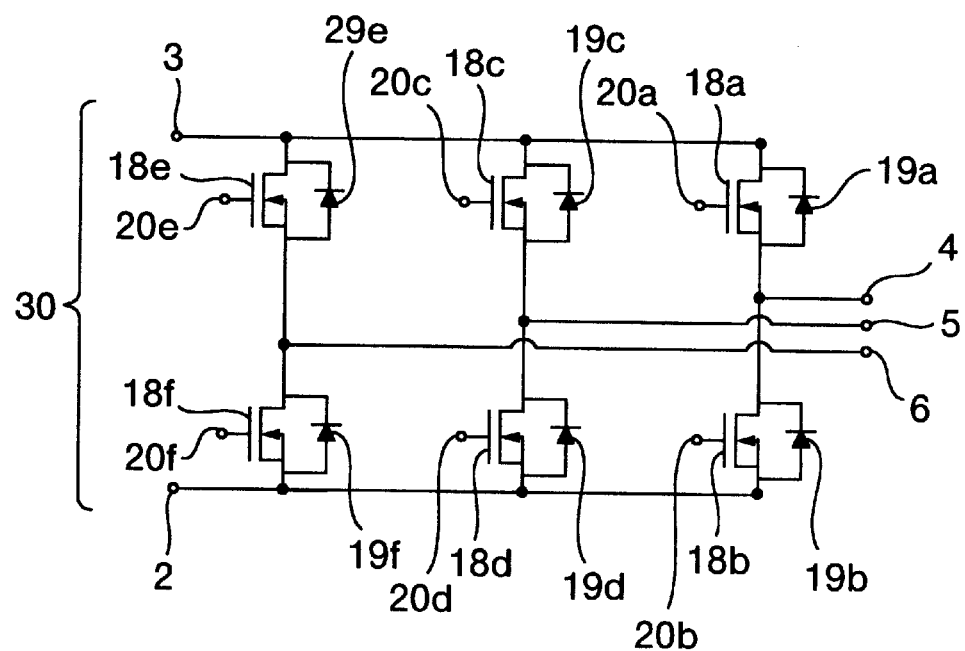
FIG. 9 is a bridge circuit diagram of a semiconductor apparatus.

FIG. 9 shows an example of a minimum necessary structure of the semiconductor apparatus 30 for outputting the UVW three-phase AC. In FIG. 9, reference numeral 30 denotes the semiconductor apparatus, reference numerals 18a to 18f denote semiconductor switches, reference numerals 19a to 19f denote diodes and reference numerals 20a to 20f denote semiconductor switch controlling terminals. Reference numeral 3 denotes a positive terminal, reference numeral 2 denotes a negative terminal, reference numeral 4 denotes a W phase output terminal, reference numeral 5 denotes a V phase output terminal and reference numeral 6 denotes a U phase output terminal. These terminals 4, 5 and 6 constitute together a set of three-phase AC terminals. A DC voltage is impressed across the positive terminal 3 and the negative terminal 2. A drive circuit for driving ON/OFF signals of the semiconductor switches is omitted from FIG. 9 to simplify illustration.

Each semiconductor switch 18a to 19f uses a power MOSFET or an IGBT. When the power MOSFET is used for the semiconductor switch, the semiconductor switch 18a and the diode 19a can be constituted into one chip because the power MOSFET contains a diode in its device structure. In the present invention, too, the diode need not be mounted as a separate component when the power MOSFET is used for the semiconductor switch.

The semiconductor switch 18a with the semiconductor switch 18b, the semiconductor switch 18c with the semiconductor switch 18d and the semiconductor switch 18e with the semiconductor switch 18f are bridge-connected, respectively. The semiconductor apparatus 30a applies PWM (Pulse Width Modulation) control signal voltages to the semiconductor switch controlling terminals 20a to 20f, controls the ON (open)/OFF (close) time of the respective bridges of the semiconductor switches 18a to 18f, and outputs the three-phase AC having a variable frequency and a variable current from the three-phase AC output terminals 4, 5 and 6 to the load 35.

An apparatus for outputting the UVW three-phase AC can be constituted by using three semiconductor apparatuses each including the positive and negative terminals 3 and 2, the bridge-connected semiconductor switches 18a and 18b and the output terminal 6. The present invention specifically pertains to the construction of the DC wiring portion that does not depend on the number of semiconductor switches and the number of bridge circuits. Therefore, the present invention can be applied to a semiconductor apparatus including at least two controllable semiconductor switches that are bridge-connected, at least one output terminal and positive and negative DC terminals.

When the semiconductor switches 18a to 18f are switched from ON to OFF in the semiconductor apparatus 30, current value greatly vary in the lines for bridge-connecting the semiconductor switches that are switched from ON to OFF and a route formed by the main circuit lines 33a and 33b and the electrolytic capacitor 39. At this time, a voltage exceeding the DC voltage applied to the electrolytic capacitor 29 is momentarily applied to the semiconductor switches that are switched from ON to OFF. The excess voltage exceeding the DC voltage (which will be hereinafter called a "jump-up voltage") is determined by the product of the total inductance of the route and the electrolytic capacitor 29 and the differentiation value of the time change of the current in the route. When the inductance increases, therefore, the impressed voltage to the semiconductor switches increase at the time of switching. When exceeding the withstand voltage of the switches, the impressed voltage invites dielectric breakdown of the device. Particularly when the power supply voltage is low to cope with requirement for a greater current of the power converter, semiconductor switches having a low ON loss must be selected to restrict the voltage drop in the semiconductor switches. However, since the semiconductor switches having the low ON loss in general are likely to have a lower withstand voltage, the impressed voltage allowable to the device withstand voltage becomes lower. In addition, since the current change amount becomes great at the time of switching, the jump-up voltage described above becomes higher.

When the jump-up voltage increases, the switching loss of the semiconductor switches increases. The increase of this switching loss in turn invites shortening of service life of the semiconductor switches and the increase of the cost of production.

Under the circumstances described above, it is very important to reduce the wiring inductance in a power converter for controlling a large current, particularly in a power converter in which a power supply voltage is low.

Figure 2:
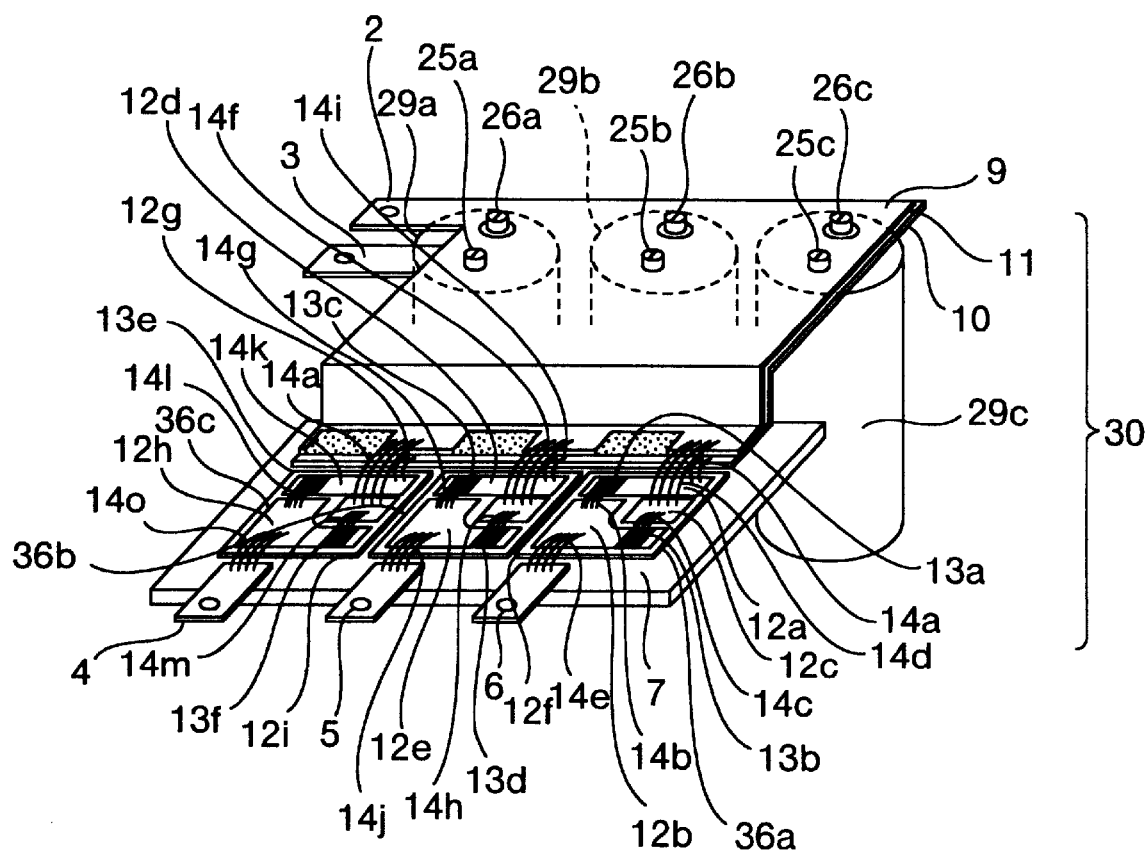
FIG. 2 is a perspective view showing a wiring structure that constitutes a semiconductor switch and a bridge circuit inside the semiconductor apparatus shown in FIG. 1.
Figure 3:
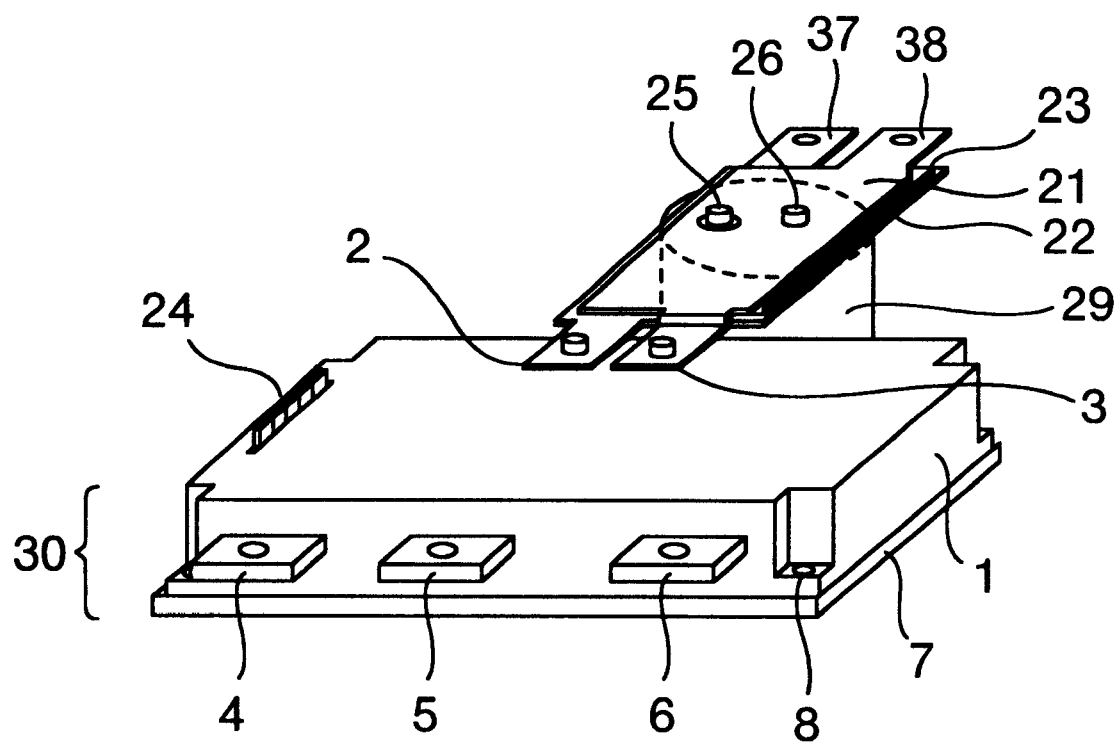
FIG. 3 is a perspective view showing a laminate wiring structure for connecting a capacitor to a semiconductor apparatus in a comparative example.

An embodiment of the present invention will be explained with reference to FIGS. 1 to 3. FIG. 1 shows the outline of a semiconductor apparatus according to this embodiment. FIG. 2 shows an example of a structure of main circuit lines of the semiconductor apparatus. FIG. 3 shows a structure of lines for connecting a capacitor and a semiconductor apparatus in a comparative example.

In FIG. 1, reference numeral 1 denotes a case, reference numeral 2 denotes a negative DC terminal, reference numeral 3 denotes a positive DC terminal, reference numerals 4 to 6 denote output terminals, reference numeral 7 denotes a metal bottom plate, reference numeral 8 denotes a screw hole, reference numeral 9 denotes a negative side conductor plate, reference numeral 10 denotes a positive side conductor plate, reference numeral 11 denotes an insulator, reference numeral 24 denotes a control auxiliary terminal, reference numerals 25a to 25c denote set screws for electrolytic capacitor negative terminals, reference numerals 26a to 26c denote set screws for electrolytic capacitor positive terminals, reference numerals 29a to 29c denote electrolytic capacitors and reference numeral 30 denotes a semiconductor apparatus. Screw holes for fitting lines to a DC power supply are formed in the terminals 2 and 3, respectively. Fitting holes for fitting output lines are formed in the output terminals 4 to 6, respectively. The screw hole 8 is used to fix cooling fins and the metal bottom plate 7 to one another by surface fixing. The positive side conductor plate 10 and the negative side conductor plate 9 have a laminate structure sandwiching the insulator 11 between them. The negative DC terminal 2 and the positive DC terminal 3 are connected to lines that are connected to the DC power supply.

FIG. 2 is a perspective view of the main circuit line structure of the semiconductor apparatus when the case 1 and the control auxiliary terminal 24 shown in FIG. 1 are removed. In FIG. 2, reference numeral 2 denotes the negative DC terminal, reference numeral 3 denotes the positive DC terminal, reference numerals 4, 5 and 6 denote the output terminals, reference numeral 9 denotes a negative side sheet-like conductor, reference numeral 10 denotes a positive side sheet-like conductor, reference numeral 11 denotes the insulator, reference numerals 12a to 12i denote substrate conductor patterns, reference numerals 13a to 13f denote diodes and semiconductor switches, reference numerals 14a to 14o denote wire lines, reference numeral 7 denotes the metal bottom plate, reference numerals 25a to 25c denote the set screws for fixing the electrolytic capacitor negative terminals, reference numerals 26a to 26c denote the set screws for fixing the electrolytic capacitor positive terminals, reference numerals 29a to 29c denote the electrolytic capacitors, reference numeral 30 denotes the semiconductor apparatus, and reference numerals 36a to 36c denote insulating substrates. FIG. 2 shows the case where the semiconductor switch uses the MOSFET, and a combination of the semiconductor switch and the diode is represented as one component.

FIG. 2 shows four lines for each of the wire lines 14a to 14o. However, the number of lines is different depending on the specification of the semiconductor apparatus and on the wire diameter, and the present invention does not particularly limit the number of lines to 4 lines.

In FIG. 2, the substrate conductor patterns 12a to 12c represent conductor portions formed on the insulating substrate 36a. The diode and the semiconductor switch 13a are soldered to the substrate conductor pattern 12a, and the diode and the semiconductor switch 13b are soldered to the semiconductor pattern 12b.

Connection of the lines in FIG. 2 will be explained in conjunction with the substrate conductor pattern on the insulating substrate 36a. Both ends of the line 14a are connected to the positive side sheet-like conductor 10 and to the substrate conductor pattern 12a. Both ends of the line 14b are connected to the diode and the source electrode of the semiconductor switch 13a and to the substrate conductor pattern 12b. Both ends of the line 14c are connected to the diode and the source electrode of the semiconductor switch 13b and to the substrate conductor 12c. Both ends of the line 14d are connected to the substrate conductor pattern 12c and to the negative side sheet-like conductor 9. Both ends of the line 14e are connected to the substrate conductor pattern 12c and to the output terminal 6. The current path formed on the insulating substrate inclusive of these lines describes a loop over the metal bottom plate 7. An eddy current flows at the time of switching through the metal bottom plate 7 in accordance with the change of the current flowing through the current path. Since the current flowing through the current path and the eddy current flowing through the metal bottom plate 7 are very close to one another, the structure of the lines and the substrate conductor pattern in FIG. 2 restricts the inductance of the current path due to electromagnetic coupling (mutual inductance). Since this connection relation of the lines with the substrate conductor pattern holds true as such in each insulating substrate 36b, 36c, their explanation is hereby omitted.

Correspondence between FIG. 2 and FIG. 9 will be explained about the bridge circuit connected to the output terminal 6. The diode and the semiconductor switch 13a in FIG. 2 correspond to 18e and 19e in FIG. 9. The diode and the semiconductor switch 13b in FIG. 2 correspond to 18f and 19f in FIG. 9. Therefore, the negative side sheet-like conductor 9, the positive side sheet-like conductor 10, the substrate conductor patterns 12a to 12c and the lines 14a to 14d correspond to the lines constituting the bridge circuits connected to the output terminal 6 in FIG. 9. The line 14e and the output terminal 6 in FIG. 2 correspond to the output terminal 6 and the lines for connecting the bridge circuit in FIG. 9. A similar correspondence shown in FIG. 2 exists in the bridge circuits connected to the output terminals 4 and 5 shown in FIG. 9.

In FIG. 2, the positive side conductor plate 10 and the negative side conductor plate 9 are the common wiring portions for the bridge circuit constituted by the semiconductor switches 13a and 13b, the bridge circuit constituted by the semiconductor switches 13c and 13d and the bridge circuit constituted by the semiconductor switches 13e and 13f. In FIG. 2, the positive side conductor plate 10 and the negative side conductor plate 9 have a laminate structure sandwiching the insulator 11 between them, and the electrolytic capacitors 36a to 36c are connected to the positive side conductor plate 10 and to the negative side conductor plate 9 by the screws 26a and 25a, 26b and 25b, and 26c and 25c, respectively.

FIG. 3 is a perspective view of a laminate wiring structure for connecting a capacitor and a semiconductor apparatus in a comparative example. Reference numeral 1 denotes a case, reference numeral 2 denotes a negative DC terminal, reference numeral 3 denotes a positive DC terminal, reference numerals 4 to 6 denote output terminals, reference numeral 7 denotes a metal bottom plate, reference numeral 8 denotes a screw hole, reference numeral 21 denotes a positive side conductor plate, reference numeral 22 denotes a negative side conductor plate, reference numeral 23 denotes an insulator, reference numeral 24 denotes a control auxiliary terminal, reference numerals 25 and 26 denote capacitor terminals, reference numeral 29 denotes an electrolytic capacitor, reference numeral 30 denotes a semiconductor apparatus, reference numeral 38 denotes a positive side terminal, and reference numeral 37 denotes a negative side terminal. Screw holes for fitting lines to a DC power supply are provided to the terminals 2 and 3, respectively. Lines to the DC power supply are connected to the positive side terminal 38 and to the negative side terminal 37.

FIG. 3 shows the laminate structure of only the wiring portion for connecting the electrolytic capacitor 29 without taking the internal construction of the semiconductor apparatus into consideration. In such a laminate wiring structure, currents in mutually opposite directions (hereinafter called "reciprocating currents") flow adjacent to each other through the positive side conductor plate 21 and through the negative side conductor plate 22. In this instance, strong electromagnetic coupling that occurs between the currents flowing in the mutually opposite directions reduces the inductance.

It will be hereby assumed in the construction shown in FIG. 3 that the width of the negative and positive DC terminals 2 and 3 is 10 mm, the gap between the negative and positive DC terminals 2 and 3 is 5 mm, the sheet thickness of the positive and negative side conductor plates 21 and 22 is 1 mm, the thickness of the insulator 23 of the positive and negative side conductor plates 21 and 22 is 1 mm, the distance from the DC terminals 2 and 3 of the semiconductor apparatus to the capacitor terminals is 80 mm, and the gap between the capacitor terminals 25 and 26 is 30 mm. When the inductance of the wiring portion for connecting the electrolytic capacitor 29 is calculated roughly on this assumption, the inductance is about 7 nH at the terminal portion of the electrolytic capacitor 29 in both positive and negative side conductor plates 21 and 22 at which the reciprocating currents do not flow adjacent to each other and at which the inductance reducing effect is low, is about 5 nH at the portion from the DC terminal of the semiconductor apparatus 30 to its capacitor terminal at which the inductance reducing effect due to the reciprocating currents is great, and is about 20 nH at the connection portions of the lines for connecting the electrolytic capacitor 29 and the DC terminals of the semiconductor apparatus 30 at which the reciprocating currents do not flow adjacent to each other. Assuming hereby that the internal inductance of the electrolytic capacitor is 20 nH and the wiring inductance inside the semiconductor apparatus 30 is 30 nH, the inductance of the lines connecting the electrolytic capacitor 29 and the DC terminal connecting portion of the semiconductor apparatus 30 occupies about 25% of the total inductance calculated as above. This rough calculation value varies with the conductivity of the conductor plates, the shapes of the holes of the conductor plates for connecting the capacitor terminals, and so forth, but is given as the numeric value that can be achieved in practice.

In the construction shown in FIGS. 1 and 2, the positive side conductor plate 10 and the negative side conductor plate 9 laminated are extended outside the case while they are kept laminated, and the electrolytic capacitors 29 are connected to these positive and negative side conductor plates 10 and 9. This construction can reduce the inductance at the connecting portion of the lines for connecting the electrolytic capacitors 29 and the DC terminals of the semiconductor apparatus 30 in the comparative example shown in FIG. 3, to zero or to an extremely small value. The laminated positive and negative side conductor plates 10 and 9 inside the semiconductor apparatus are extended while they keep a large width in this embodiment. Consequently, the current concentration that occurs at the DC terminals shown in FIG. 3 can be eliminated. Moreover, a plurality of electrolytic capacitors can be connected more easily to the laminated conductor plate. The embodiment shown in FIGS. 1 and 2 can therefore eliminate the inductance occurring at the connecting portion of the lines for connecting the electrolytic capacitors and the DC terminals of the semiconductor apparatus in the comparative example shown in FIG. 3. In addition, this embodiment can also lower the inductance at other portions. The term "large width (wide)" used in this specification means the width greater than at least the width of a AlN substrate for one-phase (e.g. insulating substrate 36a, 36b, 36c). In FIG. 1, the term means the width ranging to the bridge circuits of the three phases.

It will be assumed in the construction shown in FIGS. 1 and 2 that the laminate structure and the electrolytic capacitors are the same as those described above and the semiconductor apparatus has a size of 120 mm (length), 140 mm (width) and 30 mm (height). When calculated roughly on this assumption, the inductance is about 15 nH in the current path flowing through the lines 14a to 14d and through the substrate patterns 13a to 13c, is about 5 nH at the lamination portion of the positive side conductor plate 10 and the negative side conductor plate 9, and is about 3 nH at the capacitor terminal portions. Assuming that the internal inductance of the capacitors is about 7 nH, the inductance may be reduced by about 60% in comparison with the rough calculation result given above. This inductance varies depending on the number of bonding wires 14 and on the roof top height, but is given as the numeric value that can be achieved in practice. In FIGS. 1 and 2, the rough calculation value of the inductance at the capacitor terminal portion is about 7 nH when the electrolytic capacitor is only one. Assuming that the internal inductance of the capacitor is about 20 nH, the inductance may be reduced by about 40% in comparison with the rough calculation result of the construction shown in FIG. 3.

Next, the problem of the withstand voltage of the semiconductor switch will be examined. From the rough calculation formula of the jump-up voltage, i.e. [(inductance)× (cutoff current)/(rise time)], 60% reduction of the inductance represents that the current of about 2.5 times can be cut off. It can thus be appreciated that the embodiment shown in FIGS. 1 and 2 is effective for increasing the current of the power 43 converter.

Next, another embodiment of the present invention, wherein the positive/negative DC terminal structure of the semiconductor apparatus is modified to further improve mounting flexibility such as the component arrangement of the power converter, the wiring structure, and so forth, on the basis of the construction shown in FIGS. 1 and 2, will be explained with reference to FIGS. 4, 5 and 6.

Figure 4:
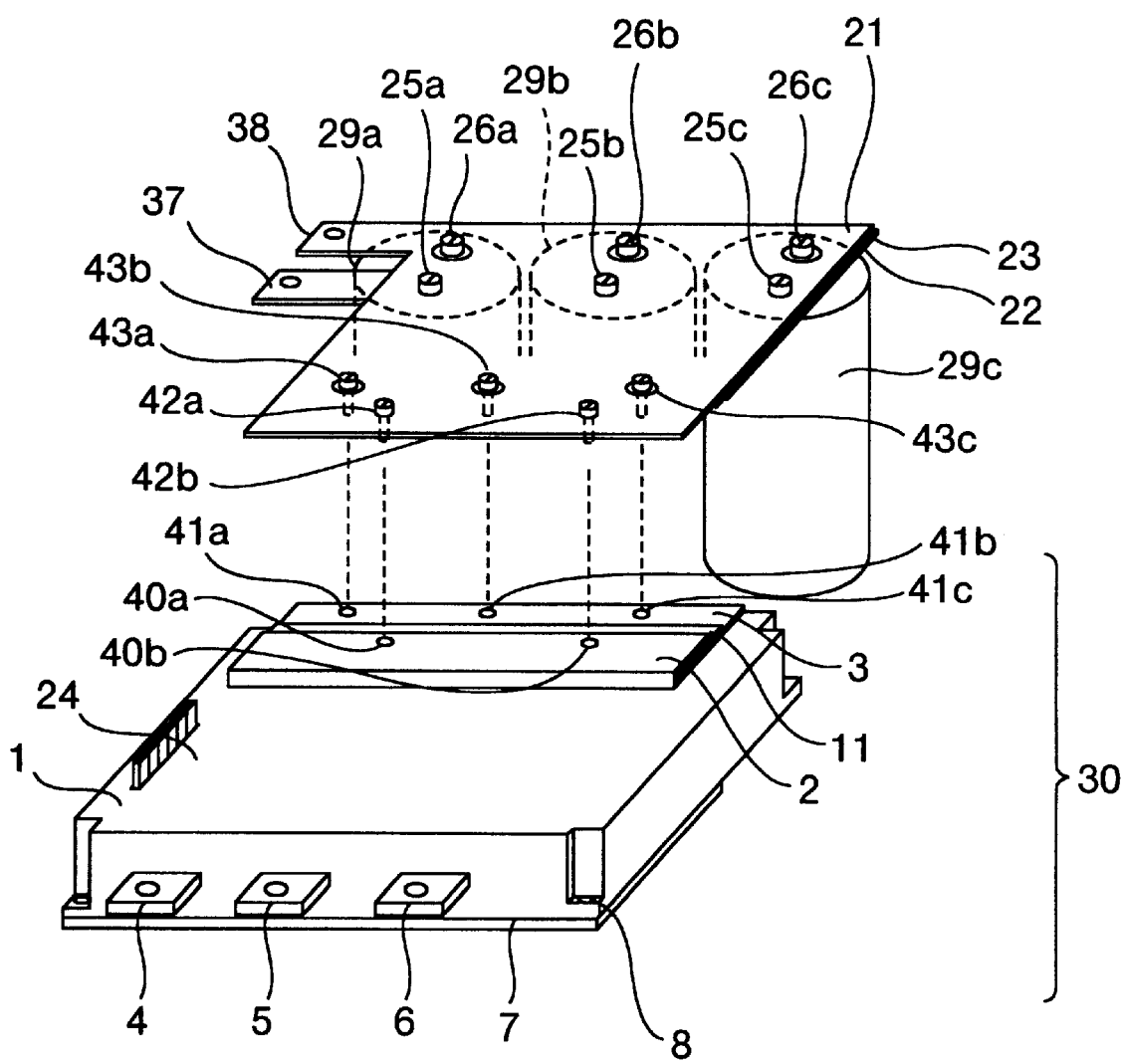
FIG. 4 is a perspective view of a power converter using the semiconductor apparatus according to one embodiment of the present invention.

FIG. 4 is a perspective view showing a semiconductor apparatus 30 and a connection example of a conductor plate structure for connecting the semiconductor apparatus 30 and electrolytic capacitors 29.

In FIG. 4, reference numeral 1 denotes a case, reference numeral 2 denotes a negative DC terminal, reference numeral 3 denotes a positive DC terminal, reference numerals 4, 5 and 6 denote output terminals, reference numeral 7 denotes a metal bottom plate, reference numeral 8 denotes a screw hole, reference numeral 11 denotes an insulator, reference numeral 21 denotes a negative side conductorplate, reference numeral 22 denotes a positive side conductor plate, reference numeral 23 denotes an insulator, reference numerals 25a, 25b and 25c denote set screws 45 for fixing electrolytic capacitor negative terminals, reference numerals 26a, 26b and 26c denote set screws for fixing electrolytic capacitor positive terminals, reference numerals 29a, 29b and 29c denote electrolytic capacitors, reference numeral 30 denotes a semiconductor apparatus, reference numeral 36 denotes a positive terminal, reference numeral 37 denotes a negative terminal, reference numerals 40a and 40b denote set screws for fixing negative DC terminals, reference numerals 41a, 41b and 41c denote set screws for fixing positive DC terminals, reference numerals 42a and 42b denote set screws for fixing negative side conductor plates, and reference numerals 43a, 43b and 43c denote set screws for fixing positive side conductor plates. Holes corresponding to the set screws 40a, 40b of the negative side conductor plate and to the set screws 43a to 43c for the positive side conductor plate and holes for keeping insulation relative to the opposing conductor plates are formed in both positive and negative side conductor plates 21 and 22, respectively, though these holes are not represented by reference numerals. In FIG. 4, the positive side conductor 21 with the positive DC terminal 3 and the negative side conductor plate 22 with the negative DC terminals are brought into surface contact by screws, respectively. The electrolytic capacitors 29a to 29c are connected to the negative side conductor plate 22 and to the positive side conductor plate 21 at the capacitor terminals 25a to 25c and at the capacitor terminals 26a to 26c, respectively. The positive terminal 36 and the negative terminal 37 are connected to the DC power supply. The output terminals 4 to 6 are connected to the load.

Figure 5:
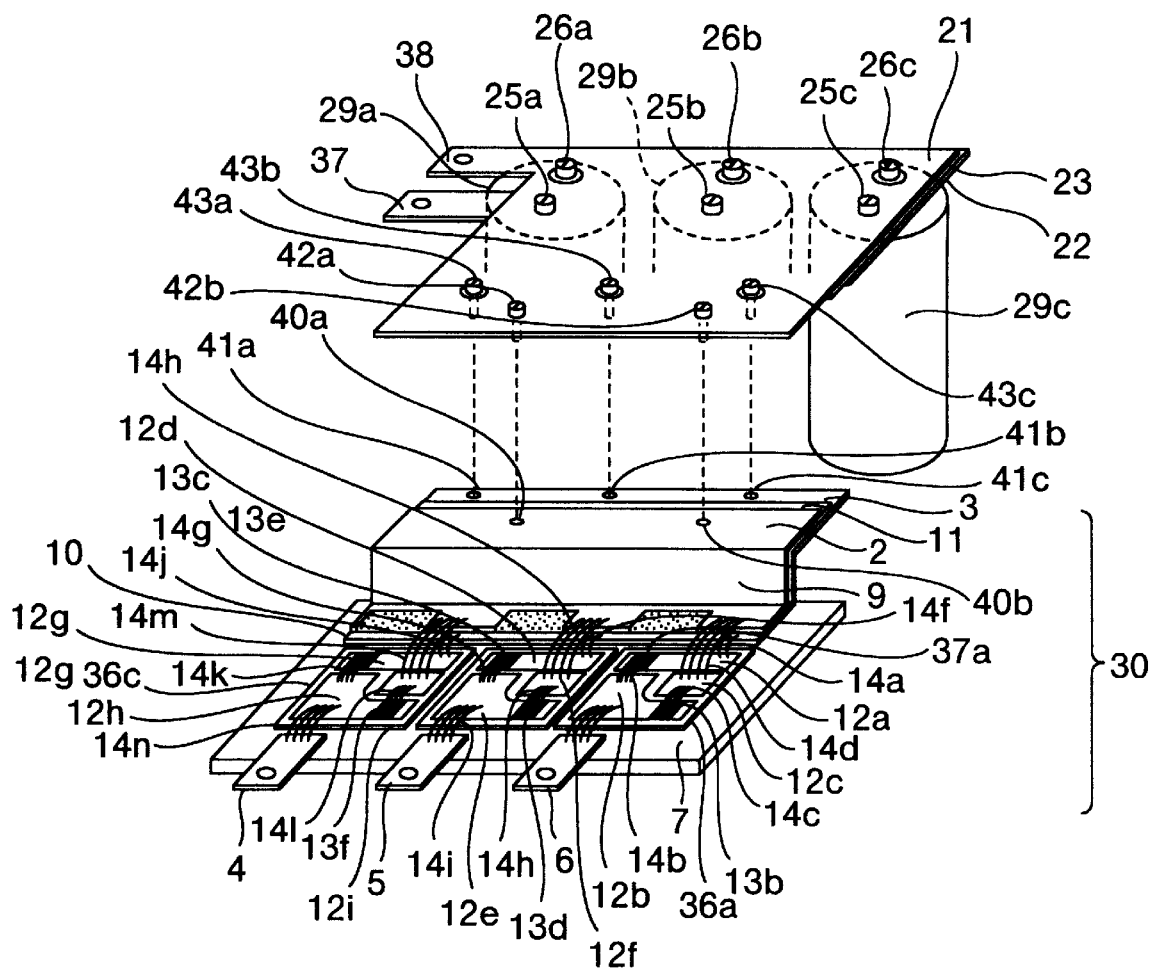
FIG. 5 is a perspective view showing a wiring structure that constitutes a semiconductor switch and a bridge circuit inside the semiconductor apparatus shown in FIG. 4.

FIG. 5 is a perspective view of a main circuit wiring structure exclusive of the case 1 and the control auxiliary terminal 24 shown in FIG. 4. In FIG. 5, reference numeral 1 denotes a case, reference numeral 2 denotes a negative DC terminal, reference numeral 3 denotes a positive DC terminal, reference numerals 4, 5 and 6 denote output terminals, reference numeral 7 denotes a metal bottom plate, reference numeral 8 denotes a screw hole, reference numeral 9 denotes a negative side conductor plate, reference numeral 10 denotes a positive side conductor plate, reference numeral 11 denotes an insulator, reference numerals 12a to 12i denote substrate conductor patterns, reference numerals 13a to 13f denote diodes and semiconductor switches, reference numerals 14a to 14o denote wire lines, reference numeral 21 denotes a negative side conductor plate, reference numeral 22 denotes a positive side conductor plate, reference numeral 23 denotes an insulator, reference numerals 25a to 25c denote set screws for fixing electrolytic capacitor negative terminals, reference numerals 26a to 26c denote set screws for fixing electrolytic capacitor positive terminals, reference numerals 29a to 29c denote electrolytic capacitors, reference numeral 30 denotes a semiconductor apparatus, reference numerals 36a to 36c denote insulating substrates, reference numeral 36 denotes a positive terminal, reference numeral 37 denotes a negative terminal, reference numerals 40a and 40b denote set screws for fixing negative DC terminals, reference numerals 41a to 41c denote set screws for fixing positive DC terminals, reference numerals 42a and 42b denote set screws for fixing a negative side conductor plate, and reference numerals 43a to 43c denote set screws for fixing a positive side conductor plate. FIG. 5 shows the case where MOSFETs are used for the semiconductor switches. The combination of the semiconductor switch and the diode is represented as one component.

In the DC terminal structure of the semiconductor apparatus, FIGS. 4 and 5 show a step-like structure in which the negative conductor plate 9, the insulator 11 and the positive conductor plate 10 of the semiconductor apparatus are serially elongated while their width is left wide. Connection between the negative side conductor plate 21 and the positive side conductor plate 22 at the DC terminal portion of the semiconductor apparatus will be explained with reference to a schematic view (FIG. 6) when it is viewed from the side surface of the semiconductor apparatus.

Figure 6:
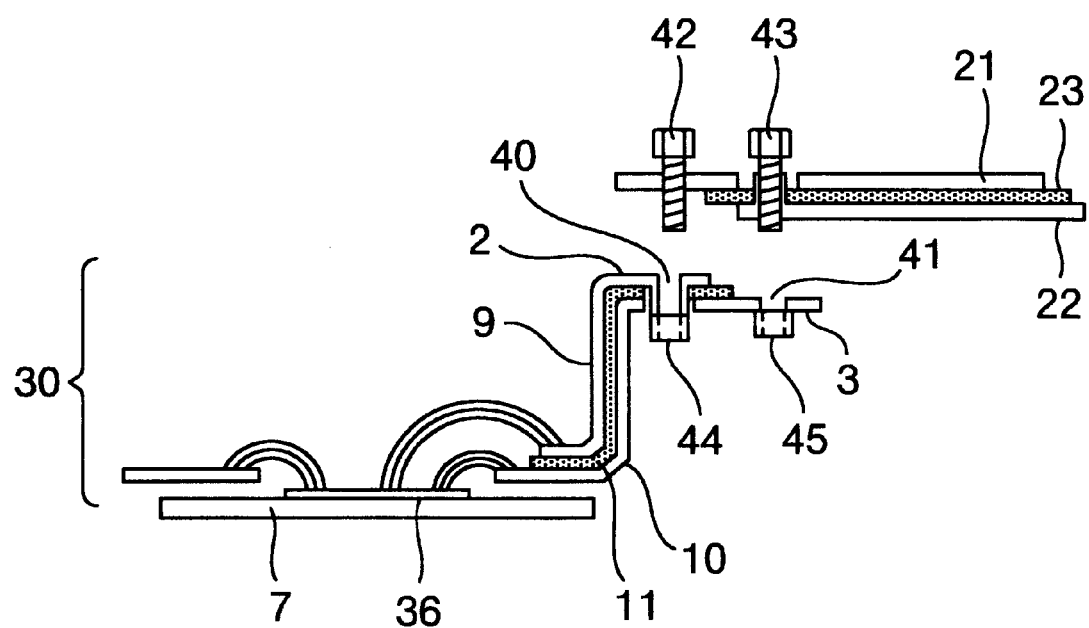
FIG. 6 is a perspective view showing a structure of a DC terminal portion of the semiconductor apparatus shown in FIG. 5.

FIG. 6 is a schematic view when the structure shown in FIG. 5 is viewed from the side surface. In FIG. 6, the components that are not necessary for the explanation of the structure of the DC terminal portion of the semiconductor apparatus are omitted. In FIG. 6, reference numeral 2 denotes a negative DC terminal, reference numeral 3 denotes a positive DC terminal, reference numeral 7 denotes a metal bottom plate, reference numeral 9 denotes a negative side conductor plate, reference numeral 10 denotes a positive side conductor plate, reference numeral 11 denotes a insulator, reference numeral 14 denotes a wire line, reference numeral 21 denotes a negative side conductor plate, reference numeral 22 denotes a positive side conductor plate, reference numeral 23 denotes an insulator, reference numeral 30 denotes a semiconductor apparatus, reference numeral 36 denotes an insulating substrate, reference numeral 40 denotes a set screw for fixing a negative DC terminal, reference numeral 41 denotes a set screw for fixing a positive DC terminal, reference numeral 42 denotes a set screw for fixing a negative side conductor plate, reference numeral 43 denotes a set screw for fixing a positive side conductor plate, and reference numerals 44 and 45 denote nuts.

FIG. 6 shows the step-like structure of the negative and positive DC terminals 2 and 3 in which the negative conductor plate 9, the insulator 11 and the positive conductor plate 10 are serially elongated at the DC terminal portion of the semiconductor apparatus while their width is kept wide. In this drawing, the structure of the conductor plates for connecting the electrolytic capacitor has a step-like structure of the negative conductor plate 21, the insulator 23 and the positive conductor plate 22 in such a fashion as to oppose the structure of the DC terminal portion of the semiconductor apparatus described above. When the set screw 42 for the negative side conductor plate is meshed with the nut 44 and the set screw 43 for the positive side conductor plate is meshed with the nut 45, the negative conductor plate 9 with the negative conductor plate 21 and the positive conductor plate 10 with the positive conductor plate 22 can be brought into surface connection with one another, respectively. As a result of this surface connection, the negative conductor plate 9 with the negative conductor plate 21 and the positive conductor plate 10 with the positive conductor plate 22 can be regarded electrically as one conductor, respectively. In this way, the inductance reducing effect can be accomplished in the same way as in the embodiment shown in FIGS. 1 and 2. Incidentally, in the semiconductor apparatus shown in FIGS. 4, 5 and 6, the positive and negative terminals are fixed by the screws at two or more positions to keep the effect of surface connection.

In the semiconductor apparatus explained with reference to FIGS. 4, 5 and 6, the shape of laminated sheet-like wiring constituted by the negative conductor plate 21, the insulator 23 and the positive conductor plate 22 can be modified in accordance with the power converter. Such a semiconductor apparatus can achieve a greater capacity of the power converter resulting from the reduction of the inductance equal to that of the semiconductor apparatus shown in FIGS. 1 and 2, and can also improve mounting flexibility such as the component arrangement and the wiring structure.

Next, an application of a power converter using the semiconductor apparatus of the present invention to a driving system of an automobile will be explained as another embodiment of the present invention.

Figure 7:
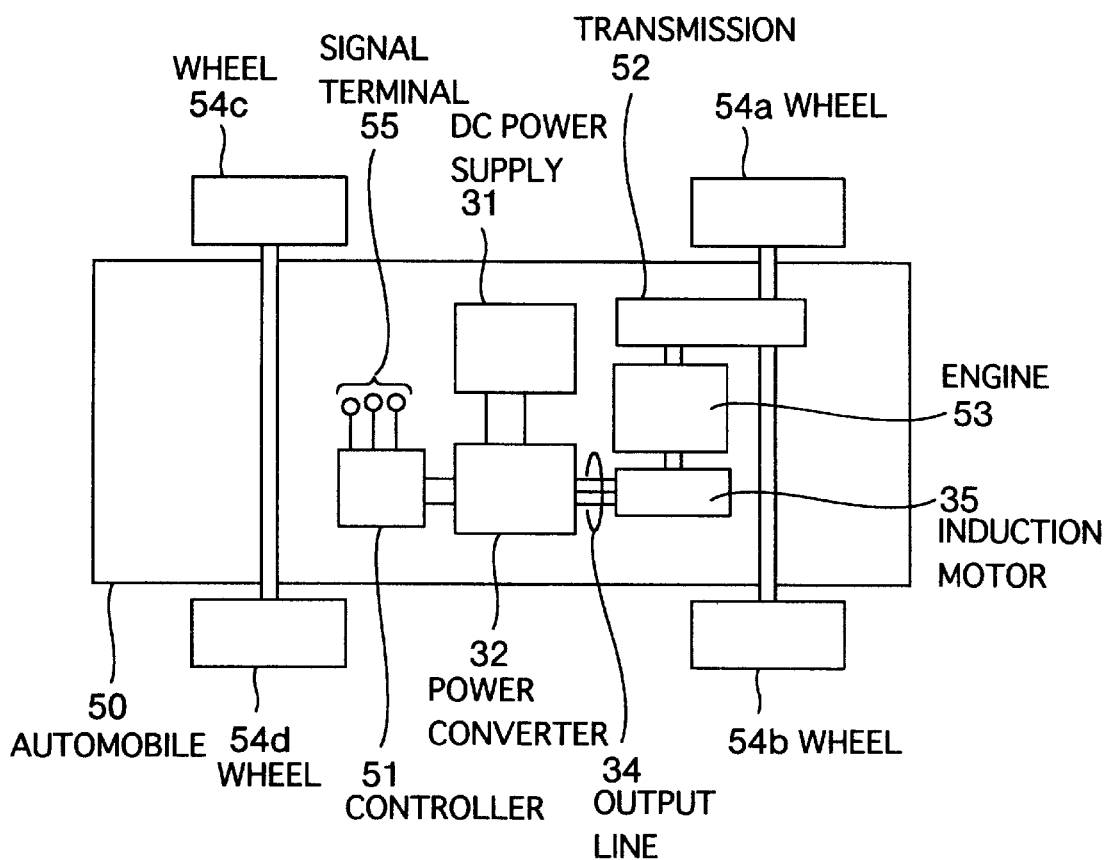
FIG. 7 is a structural view of an automobile having a driving system that uses a power converter according to the present invention.

FIG. 7 is a structural view of an automobile according to this embodiment of the present invention.

In FIG. 7, reference numeral 35 denotes an induction motor, reference numeral 46 denotes a power converter, reference numeral 47 denotes a DC power supply, reference numeral 48 denotes an output line, reference numeral 50 denotes an automobile, reference numeral 51 denotes a controller, reference numeral 52 denotes a transmission, reference numeral 53 denotes an .engine, reference numerals 54a to 54d denote wheels and reference numeral 55 denotes signal terminals. The signal terminals 55 receive signals such as start, acceleration, deceleration and stop command signals from a driver. The controller 51 transmits control signals to the power converter on the basis of the information it receives through the signal terminals, and drives the induction motor 35. The induction motor 35 applies torque to an engine shaft of the engine 53 and drives the wheels through the transmission 52.

In the driving system shown in FIG. 7, the induction motor 35 can drive the wheels 54a and 54b even when the engine 53 of the automobile is at halt. The induction motor 35 can assist torque when the engine 53 operates, too. When the engine 53 drives the induction motor 35 and the power converter 35 converts the AC generated by the induction motor 35 to the DC, the DC power supply 47 can be electrically charged. The engine 53 and the induction motor 35 are connected to each other either directly or through gears. In one driving form, driving of the wheels is started when the induction motor 35 starts turning. The engine is caused to start operating when the induction motor 35 drives the engine shaft and revolution of the engine shaft reaches a predetermined number of revolutions. When the engine starts operating, driving of the wheels is started. When the driving system has a small height, it can be arranged below the floor of the car body. It can be arranged also at the center or the former or latter half of the car body. Alternatively, the driving system can be dispersedly arranged at several portions. The semiconductor apparatus is cooled by a water-cooling or air-cooling system. A cooling system of the engine can be used in common in the case of the water-cooling system. When a dedicated water-cooling system is employed, however, service life of the semiconductor apparatus can be extended. In the case of air-cooling, the driving system preferably has cooling fins. The cooling fins are preferably arranged at lower temperature portions such as inside a driver's room than inside the engine. When a boiling cooling system is employed, the driving system preferably has a heat pipe.

In the driving system shown in FIG. 7, large torque is required when the induction motor drives alone the wheels or assists torque. Therefore, the induction motor 35 must be driven at a large current and for this purpose, a power converter capable of controlling a large current is essentially necessary. In this aspect, the power converter using the semiconductor apparatus according to the present invention can offer an automobile having a driving system that can satisfy greater torque. An automobile frequently moves back and forth. In this instance, the present invention is effective as a large current condition is created in the output line 34, etc, to generate torque. Besides the induction motor 35, other motors can also be used so long as they can exhibit predetermined performance necessary for driving the automobile.

The semiconductor apparatus having the wiring and terminal structure according to the embodiment of the present invention or the power converter using the semiconductor device and the laminate wiring for connecting the electrolytic capacitors can restrict the jump-up voltage applied to the semiconductor switches and the semiconductor device loss at the time of switching. Therefore, the present invention can provide the semiconductor apparatus and the power converter capable of outputting a greater current by merely changing the wiring structure of the semiconductor apparatus and the power converter. The present invention can also provide an automobile having a high torque motor driving system by the power converter mounted thereto.

The present invention can provide the semiconductor apparatus capable of reducing the wiring inductance as the cause of the occurrence of the jump-up voltage, the power converter and the automobile using the power converter.

What is claimed is:

1. A semiconductor apparatus including at least two controllable semiconductor switches, at least one output terminal and a case equipped with said output terminal, wherein a positive side conductor plate and a negative side conductor plate for bridge-connecting said semiconductor switches are laminated while sandwiching an insulator between at least a part thereof, and said positive side conductor plate and said negative side conductor plate so laminated are exposed to a surface of said case.

2. A semiconductor apparatus including at least two controllable semiconductor switches, at least one output terminal and a case equipped with said output terminal, wherein a positive side conductor plate and a negative side conductor plate for bridge-connecting said semiconductor switches are laminated while sandwiching an insulator between at least a part thereof, said positive side conductor plate and said negative side conductor plate so laminated have an extension portion extending outside said case, and a plurality of terminals are provided to said extension portion.

3. A power converter comprising:
a semiconductor apparatus; and
electrolytic capacitors;
said semiconductor apparatus including at least two controllable semiconductor switches bridge-connected, at least one output terminal and a case equipped with said output terminal, wherein a positive side conductor plate and a negative side conductor plate for bridge-connecting said semiconductor switches are laminated while sandwiching an insulator between at least a part thereof, and said positive side conductor plate and said negative side conductor plate so laminated have an extension portion extending outside said case, and a plurality of terminals are provided to said extension portion;

said electrolytic capacitors being connected to a part of said plurality of terminals at said extension portion of said semiconductor apparatus;

the rest of said plurality of terminals being used as DC input terminals.

4. An automobile including said power converter according to claim 3, a power supply for supplying DC power to said power converter and a motor to which an output of said power converter is inputted, said automobile being at least moved back and forth by said motor.

5. A semiconductor apparatus including at least six controllable semiconductor switches, one set of three-phase AC terminals, at least two positive and negative DC terminals, a conductor for connecting said output terminal and said semiconductor switches, a conductor for connecting said DC terminals and said semiconductor switches and a case equipped with said output terminal, wherein a positive side conductor plate and a negative side conductor plate for bridge-connecting said semiconductor switches are constituted into a wide conductor, and are laminated while sandwiching an insulator between at least a part thereof, and said positive side conductor plate and said negative side conductor plate so laminated are extended outside said case, and at least one capacitor is connected to said extension portion of said positive side conductor plate and said negative side conductor plate.

6. A semiconductor apparatus including at least two controllable semiconductor switches, at least one output terminal, at least two positive and negative DC terminals, a conductor for connecting said output terminal and said semiconductor switches, a conductor for connecting said DC terminals and said semiconductor switches, and a case equipped with said output terminal and said DC terminals, wherein a positive side conductor plate and a negative side conductor plate for bridge-connecting said semiconductor switches are constituted into wide conductors and are laminated while sandwiching an insulator between them, said DC terminal portion has a wide surface structure by extending, into a step shape, a laminate portion of said upper conductor plate, said insulator and said lower conductor plate among said positive side conductor plate and said negative side conductor plate, a conductor plate for connecting a capacitor is superposed with said DC terminal portion, and at least two set screw positions for establishing surface contact are provided to the conductor surface of each of said upper and lower conductor plates.

7. An automobile including said power converter according to claim 6, a power supply for supplying DC power to said power converter and a motor to which an output of said power converter is inputted, said automobile being at least moved back and forth by said motor.

8. A semiconductor apparatus including at least six controllable semiconductor switches, one set of three-phase AC terminals, at least two positive and negative DC terminals, a conductor for connecting said output terminal and said semiconductor switches, a conductor for connecting said DC terminals and said semiconductor switches and a case equipped with said output terminal and said DC terminal, wherein a positive side conductor plate and a negative side conductor plate for bridge-connecting said semiconductor switches are constituted into a wide conductor and are laminated while sandwiching an insulator between at least a part thereof, and said DC terminal portion has a wide surface structure formed by extending, into a step shape, a laminate portion of said upper conductor plate, said insulator and said lower conductor plate among said positive side conductor plate and said negative side conductor plate, and at least two set screw positions for superposing and bringing from above said conductor plate into surface contact with said DC terminal portion are provided to a conductor surface of each of said upper and lower conductor plates.

9. An automobile including said power converter according to claim 8, a power supply for supplying DC power to said power converter and a motor to which an output of said power converter is inputted, said automobile being at least moved back and forth by said motor.

10. A power converter comprising:
   a semiconductor apparatus for converting an input DC voltage to an AC having a variable voltage and a variable frequency; and
   capacitors for restricting fluctuation of a DC voltage;
   said semiconductor apparatus including at least two controllable semiconductor switches bridge-connected, at least one output terminal and a case equipped with said output terminal, wherein a positive side conductor plate and a negative side conductor plate for bridge-connecting said semiconductor switches are laminated while sandwiching an insulator between at least a part thereof, and said positive side conductor plate and said negative side conductor plate so laminated are exposed to a surface of said case.

11. An automobile including said power converter according to claim 10, a power supply for supplying DC power to said power converter and a motor to which an output of said power converter is inputted, said automobile being at least moved back and forth by said motor.

12. A power converter comprising:
   a semiconductor apparatus for converting an input DC voltage to an AC having a variable voltage and a variable frequency; and
   capacitors for restricting fluctuation of a DC voltage;
   said semiconductor apparatus including at least six controllable semiconductor switches, one set of three-phase AC terminals, at least two positive and negative DC terminals, a conductor for connecting said output terminal and said semiconductor switches, a conductor for connecting said DC terminals and said semiconductor switches, and a case equipped with said output terminal, wherein a positive side conductor plate and a negative side conductor plate for bridge-connecting said semiconductor switches are constituted into a wide conductor and are laminated while sandwiching an insulator between at least a part thereof, and said positive side conductor plate and said negative side conductor plate so laminated are extended outside said case and at least one capacitor is connected to said extension portion of said positive side conductor plate and said negative side conductor plate so laminated.

13. A power converter comprising: a semiconductor apparatus for converting an input DC voltage to an AC having a variable voltage and a variable frequency; and
   capacitors for restricting fluctuation of a DC voltage;
   said semiconductor apparatus including at least two controllable semiconductor switches, at least one output terminal and a case equipped with said output terminal, wherein a positive side conductor plate and a negative side conductor plate for bridge-connecting said semiconductor switches are laminated while sandwiching an insulator between at least a part thereof and are extended outside said case to form an extension portion, and a plurality of terminal are provided to said extension portion of said positive side conductor plate and said negative side conductor plate so laminated; and
   wherein two wide conductors laminated by sandwiching an insulator between them and connected to at least one capacitor are brought into surface contact by at least two screws with said positive and negative DC terminals of said semiconductor apparatus.

* * * * *